(12) United States Patent
Adachi et al.

(10) Patent No.: US 11,792,929 B2
(45) Date of Patent: *Oct. 17, 2023

(54) WIRING SUBSTRATE AND METHOD FOR MANUFACTURING WIRING SUBSTRATE

(71) Applicant: IBIDEN CO., LTD., Gifu (JP)

(72) Inventors: Takema Adachi, Ogaki (JP); Daisuke Minoura, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/588,457

(22) Filed: Jan. 31, 2022

(65) Prior Publication Data

US 2022/0248533 A1 Aug. 4, 2022

(30) Foreign Application Priority Data

Feb. 4, 2021 (JP) .................................. 2021-016509

(51) Int. Cl.
*H05K 1/02* (2006.01)
*H05K 1/09* (2006.01)
(Continued)

(52) U.S. Cl.
CPC ............... *H05K 1/116* (2013.01); *H05K 3/26* (2013.01); *H05K 3/389* (2013.01); *H05K 3/422* (2013.01); *H05K 2201/0989* (2013.01)

(58) Field of Classification Search
CPC .......... H05K 1/09; H05K 1/113; H05K 1/116; H05K 1/0298; H05K 3/0035; H05K 3/26; H05K 3/38; H05K 3/383; H05K 3/421; H05K 3/422; H05K 3/428; H05K 3/4661; H05K 2201/096; H05K 2201/0989;
(Continued)

(56) References Cited

U.S. PATENT DOCUMENTS

2015/0014027 A1* 1/2015 Kaneko .................. H05K 1/113
174/255
2016/0064319 A1* 3/2016 Suzuki .............. H01L 23/49822
174/251
(Continued)

FOREIGN PATENT DOCUMENTS

JP 2018-172759 A 11/2018

*Primary Examiner* — Xiaoliang Chen
(74) *Attorney, Agent, or Firm* — Oblon, McClelland, Maier & Neustadt, L.L.P.

(57) ABSTRACT

A wiring substrate includes a first insulating layer, a first conductor layer, a second insulating layer, a second conductor layer, a connection conductor penetrating through the second insulating layer and connecting the first and second conductor layers, and a coating film formed on a surface of the first conductor layer such that the coating film is adhering the first conductor layer and the second insulating layer. The first conductor layer includes a conductor pad and a wiring pattern such that the conductor pad is in contact with the connection conductor and the wiring pattern is covered by the coating film, the conductor pad of the first conductor layer has a surface facing the second insulating layer and having a first surface roughness higher than a surface roughness of a surface of the wiring pattern, and the coating film has opening such that the opening is exposing the conductor pad entirely.

20 Claims, 9 Drawing Sheets

(51) Int. Cl.
  *H05K 3/10* (2006.01)
  *H05K 3/26* (2006.01)
  *H05K 3/38* (2006.01)
  *H01L 23/13* (2006.01)
  *H01L 23/60* (2006.01)
  *H01L 23/498* (2006.01)
  *H05K 1/11* (2006.01)
  *H05K 3/42* (2006.01)

(58) Field of Classification Search
  CPC ........... H05K 2201/09827; H05K 1/02; H05K 1/111; H05K 1/112; H05K 1/119; H05K 1/181; H05K 3/10; H05K 3/107; H05K 3/185; H05K 3/205; H05K 3/243; H05K 3/3452; H05K 3/4007; H01L 21/486; H01L 21/4846; H01L 21/4857; H01L 23/13; H01L 23/60; H01L 23/481; H01L 23/498
  USPC ....... 174/262, 250, 251, 255, 261, 263, 265; 361/262, 250, 251, 255, 261, 263, 265
  See application file for complete search history.

(56) References Cited

U.S. PATENT DOCUMENTS

| | | | |
|---|---|---|---|
| 2016/0307834 A1* | 10/2016 | Suzuki | H01L 24/73 |
| 2017/0098600 A1* | 4/2017 | Sakai | H01L 23/5226 |
| 2022/0248531 A1* | 8/2022 | Adachi | H05K 1/09 |

* cited by examiner

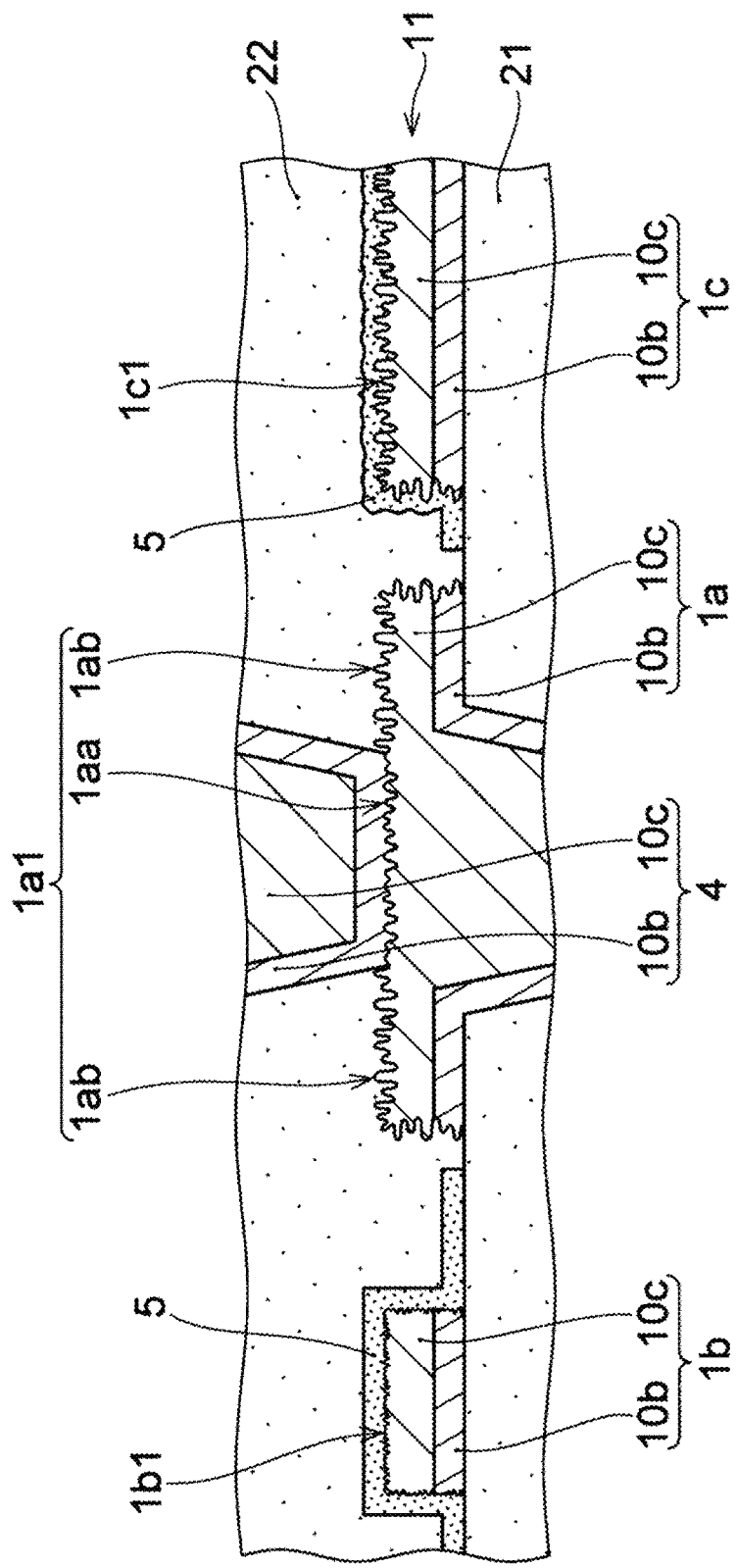

WIRING SUBSTRATE AND METHOD FOR MANUFACTURING WIRING SUBSTRATE

CROSS-REFERENCE TO RELATED APPLICATIONS

The present application is based upon and claims the benefit of priority to Japanese Patent Application No. 2021-016509, filed Feb. 4, 2021, the entire contents of which are incorporated herein by reference.

BACKGROUND OF THE INVENTION

Field of the Invention

The present invention relates to a wiring substrate and a method for manufacturing the wiring substrate.

Description of Background Art

Japanese Patent Application Laid-Open Publication No. 2018-172759 describes a printed wiring board in which a chemical conversion coating film is formed on a low-roughened or non-roughened surface of a metal wiring layer and an insulating resin layer is formed on the metal wiring layer via the chemical conversion coating film. The entire contents of this publication are incorporated herein by reference.

SUMMARY OF THE INVENTION

According to one aspect of the present invention, a wiring substrate includes a first insulating layer, a first conductor layer formed on the first insulating layer, a second insulating layer formed on the first insulating layer such that the second insulating layer is covering the first conductor layer, a second conductor layer formed on the second insulating layer on the opposite side with respect to the first conductor layer, a connection conductor penetrating through the second insulating layer and connecting the first conductor layer and the second conductor layer, and a coating film formed on a surface of the first conductor layer such that the coating film is adhering the first conductor layer and the second insulating layer. The first conductor layer includes a conductor pad and a wiring pattern such that the conductor pad is in contact with the connection conductor and that the wiring pattern is covered by the coating film, the conductor pad of the first conductor layer has a surface facing the second insulating layer and having a first surface roughness that is higher than a surface roughness of a surface of the wiring pattern, and the coating film has an opening such that the opening is exposing the conductor pad entirely.

According to another aspect of the present invention, a method for manufacturing a wiring substrate includes forming a first conductor layer on a first insulating layer such that the first conductor layer includes a conductor pad and a wiring pattern, roughening a surface of the conductor pad of the first conductor layer formed on the first insulating layer, forming a coating film on the first insulating layer and the first conductor layer such that the conductor pad is exposed entirely from the coating film, forming a second insulating layer on the first insulating layer such that the second insulating layer covers the coating film and the conductor pad, forming a second conductor layer on the second insulating layer on the opposite side with respect to the first conductor layer, and forming a connection conductor penetrating through the second insulating layer such that the connection conductor connects the second conductor layer and the conductor pad of the first conductor layer

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5A is a cross-sectional view illustrating another example of a wiring substrate according to an embodiment of the present invention;

DETAILED DESCRIPTION OF THE EMBODIMENTS

Figure 1:
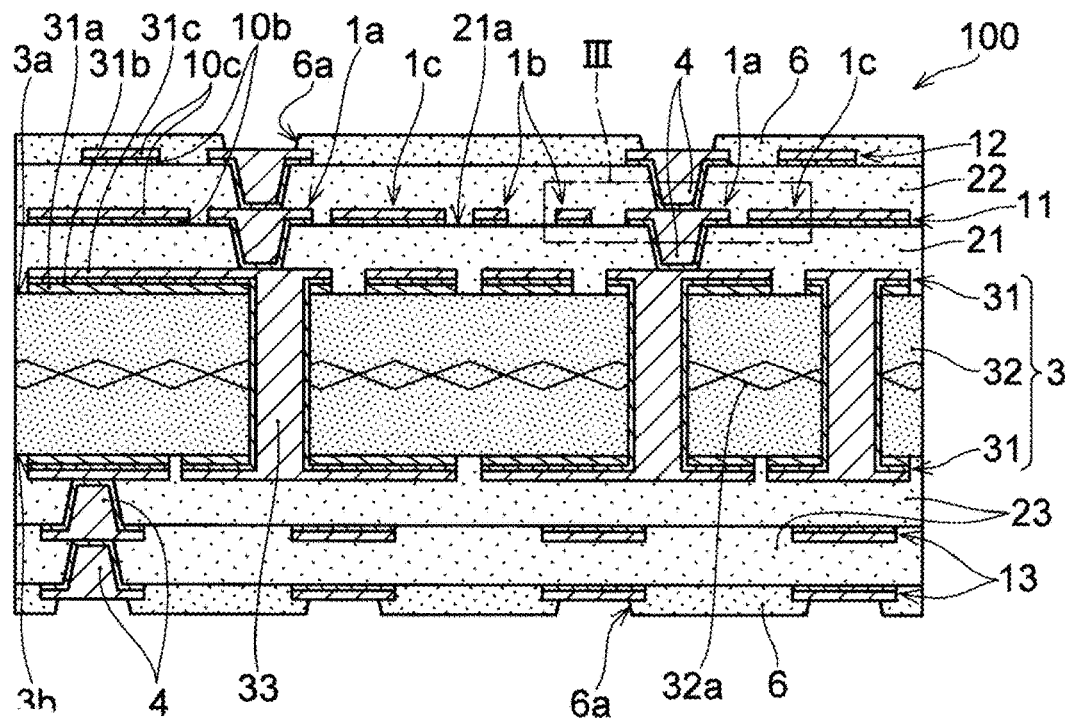
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

Figure 2:
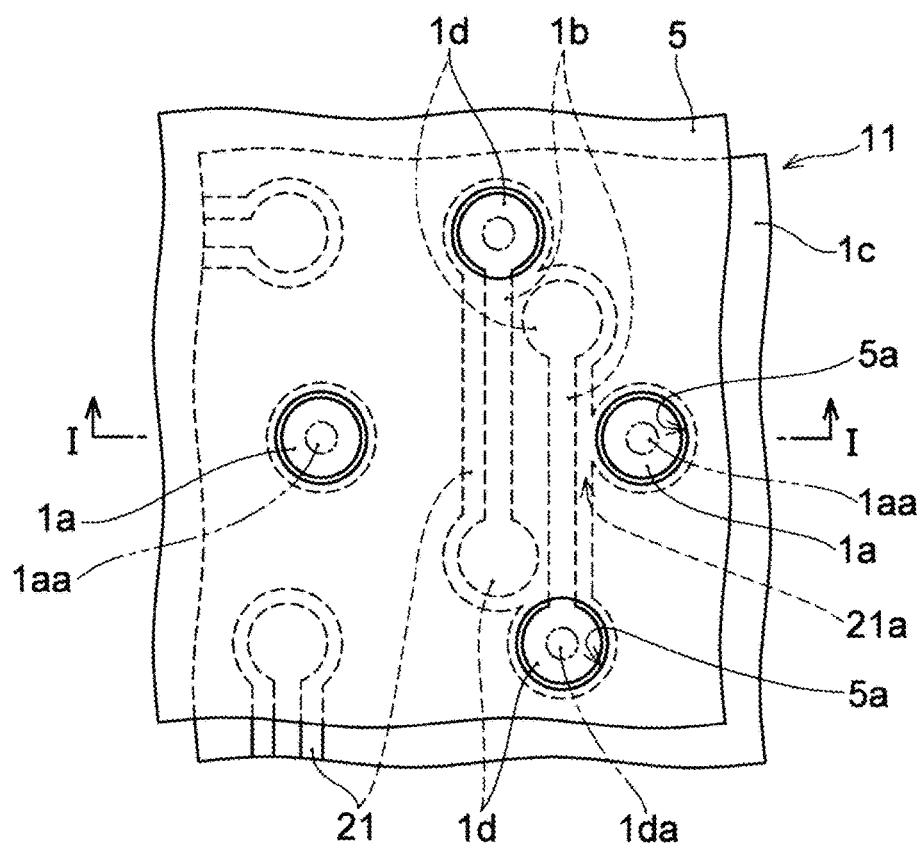
FIG. 2 is a plan view illustrating an example of conductor patterns of a first conductor layer according to an embodiment of the present invention.

A wiring substrate of an embodiment of the present invention is described with reference to the drawings. FIG. 1 is a cross-sectional view illustrating a wiring substrate 100, which is an example of the wiring substrate of the embodiment. FIG. 2 is a plan view illustrating an example of conductor patterns that are a part of a first conductor layer 11 of the wiring substrate 100. FIG. 1 illustrates a cross-sectional view at a cutting line that overlaps an I-I line in FIG. 2. The wiring substrate 100 is merely an example of the wiring substrate of the present embodiment. A laminated structure, and the number of conductor layers and the number of insulating layers of the wiring substrate of the embodiment are not limited to the laminated structure of the wiring substrate 100 of FIG. 1, and the number of conductor layers and the number of insulating layers included in the wiring substrate 100.

As illustrated in FIG. 1, the wiring substrate 100 includes a core substrate 3, and insulating layers and conductor layers that are alternately laminated on two main surfaces (a first surface (3a) and a second surface (3b)) of the core substrate 3 opposing each other in a thickness direction of the core substrate 3. The core substrate 3 includes an insulating layer 32, and conductor layers 31 that are respectively formed on both sides of the insulating layer 32.

In the description of the embodiment, a side farther from the insulating layer 32 in a thickness direction of the wiring substrate 100 is also referred to as an "upper side" or simply "upper," and a side closer to the insulating layer 32 is also referred to as a "lower side" or simply "lower." Further, for the conductor layers and the insulating layers, a surface facing the opposite side with respect to the insulating layer 32 is also referred to as an "upper surface," and a surface facing the insulating layer 32 side is also referred to as a "lower surface."

The wiring substrate 100 includes, on the first surface (3a) of the core substrate 3, a first insulating layer 21, a first conductor layer 11, a second insulating layer 22, and a second conductor layer 12. The first conductor layer 11 is formed on a surface (21a) of the first insulating layer 21, and the second insulating layer 22 is formed on the first insulating layer 21 and the first conductor layer 11. Then, the second conductor layer 12 is formed on the second insulating layer 22. The first insulating layer 21 covers the first surface (3a) of the core substrate 3, and the second insulating layer 22 covers the first conductor layer 11 and covers the first insulating layer 21 that is exposed without being covered by the first conductor layer 11. The wiring substrate 100 further includes two insulating layers 23 and two conductor layers 13 that are alternately laminated on the second surface (3b) of the core substrate 3.

The wiring substrate 100 further includes connection conductors 4 that penetrate the insulating layers and connect conductor layers that are adjacent to each other via the insulating layers. The connection conductors 4 are included in the first insulating layer 21, the second insulating layer 22, and the two insulating layers 23. The insulating layer 32 of the core substrate 3 includes connection conductors 33. The connection conductors 33 are so-called through-hole conductors that connect the conductor layers 31 on both sides of the core substrate 3.

The connection conductors 4 are so-called via conductors formed in the insulating layers that are sequentially built up. The connection conductors 4 included in the first insulating layer 21 connect the conductor layer 31 and the first conductor layer 11. The connection conductors 4 included in the second insulating layer 22 connect the first conductor layer 11 and the second conductor layer 12. The connection conductors 4 included in the two insulating layers 23 connect the conductor layer 31 and the conductor layer 13 or connect the conductor layers 13.

The first and second insulating layers (21, 22), the insulating layers 23, and the insulating layer 32 are formed of any insulating resin. Examples of the insulating resin include an epoxy resin, a bismaleimide triazine resin (BT resin), a phenol resin, and the like. In the example of FIG. 1, the insulating layer 32 contains a core material (reinforcing material) (32a) formed of a glass fiber, an aramid fiber, or the like. Although not illustrated in FIG. 1, the insulating layers other than the insulating layers 32 can also each contain a core material formed of a glass fiber or the like. The insulating layers can each further contain inorganic filler (not illustrated in the drawings) formed of fine particles of silica ($SiO_2$), alumina, mullite, or the like.

The first and second conductor layers (11, 12), the conductor layers 13, and the conductor layers 31, and the connection conductors 4 and the connection conductors 33, are each formed using any metal such as copper or nickel. In the example of FIG. 1, the conductor layers 31 each include a metal foil (31a), a metal film (31b), and a plating film (31c). The connection conductors 33 are integrally formed with the conductor layers 31, and are formed by the metal film (31b) and the plating film (31c).

On the other hand, the first and second conductor layers (11, 12) and the conductor layers 13, and the connection conductors 4 are each formed of a metal film (10b) and a plating film (10c). The connection conductors 4 are integrally formed with the first conductor layer 11, the second conductor layer 12, or the conductor layers 13. The plating films (31c, 10c) are, for example, electrolytic plating films. The metal film (31b) and the metal film (10b) are, for example, electroless plating films or sputtering film, and respectively function as power feeding layers when the plating film (31c) and the plating film (10c) are formed by electrolytic plating.

A solder resist 6 is formed on the second insulating layer 22 and the second conductor layer 12. A solder resist 6 is also formed on the surface-side insulating layer 23 and conductor layer 13 on the second surface (3b) side of the core substrate 3. The solder resists 6 are provided with openings (6a) that each expose a part of the second conductor layer 12 or a part of the conductor layer 13. The solder resists 6 are each formed of, for example, a photosensitive epoxy resin or polyimide resin, or the like.

The first conductor layer 11, the second conductor layer 12, the two conductor layers 13, and the two conductor layers 31 each include predetermined conductor patterns. The first conductor layer 11 includes conductor pads (1a) and wiring patterns (1b).

The conductor pads (1a) are in contact with the connection conductors 4 that penetrate the second insulating layer 22. That is, the conductor pads (1a) are conductor pads on which the connection conductors 4 are formed, and are so-called receiving pads for the connection conductors 4 that penetrate the second insulating layer 22. Therefore, a portion of a surface of each of the conductor pads (1a) on the second insulating layer 22 side is covered by one of the connection conductors 4 that penetrate the second insulating layer 22. In other words, a portion of the surface of each of the conductor pads (1a) on the second insulating layer 22 side faces a bottom surface of one of the connection conductors 4 that penetrate the second insulating layer 22. In the example of FIG. 1, the connection conductors 4 that penetrate the first insulating layer 21 and the connection conductors 4 that penetrate the second insulating layer 22 are formed to be stacked, and so-called stack via conductors are formed. The conductor pads (1a) are provided as so-called via pads of the connection conductors 4 (via conductors) that penetrate the first insulating layer 21.

The wiring patterns (1b) are conductor patterns that function as conductive paths used for transmission of any electrical signals or supply of electric power. Surfaces of the wiring patterns (1b) other than surfaces facing the first insulating layer 21 are covered by the second insulating layer 22. The wiring patterns (1b), for example, may independently, or in cooperation with other conductor patterns, connect predetermined transmission source and transmission destination of electrical signals, or may connect predetermined supply source and supply destination of electric power. The wiring patterns (1b) may be, for example, transmission paths for signals of high frequencies exceeding several GHz.

As illustrated in FIG. 2, two wiring patterns (1b) in the example of FIG. 1 connect two conductor pads (1d) in the first conductor layer 11. Regions (1aa, 1da) surrounded by two-dot chain lines in the conductor pads (1a, 1d) in the example of FIG. 2 indicate regions of the surfaces of the conductor pads (1a, 1d) covered by the connection conductors 4 that penetrate the second insulating layer 22.

In the example of FIGS. 1 and 2, the first conductor layer 11 further includes a conductor pattern (1c). The conductor pattern (1c) is a conductor pattern having a flat plate-like shape extending over a region where the conductor pads (1a) and the wiring patterns (1b) are not formed. The conductor pattern (1c) may be a so-called solid pattern provided in the first conductor layer 11 so as to substantially fill the region where conductors such as wirings or connection pads other than the conductor pattern (1c) are not formed. The conductor pattern (1c) is used, for example, as a ground potential or a ground plane or a power plane to which a specific power supply potential is applied.

Although omitted in FIG. 1, as illustrated in FIG. 2, the wiring substrate 100 further includes a coating film 5 that covers the first conductor layer 11 and the first insulating layer 21. In the example of FIG. 2, the coating film 5 has openings (5a). The openings (5a) expose therein the conductor pads (1a, 1d) that respectively have the regions (1aa, 1da) covered by the connection conductors 4 penetrating the second insulating layer 22. The coating film 5 in the example of FIG. 2 covers substantially entirely the surface (21a) of the first insulating layer 21 that is not covered by the first conductor layer 11 outside the openings (5a). Further, the coating film 5 in the example of FIG. 2 covers all the conductor patterns of the first conductor layer 11 except for the conductor pads (1a, 1d) that respectively have the regions (1aa, 1da) covered by the connection conductors 4.

Figure 3:
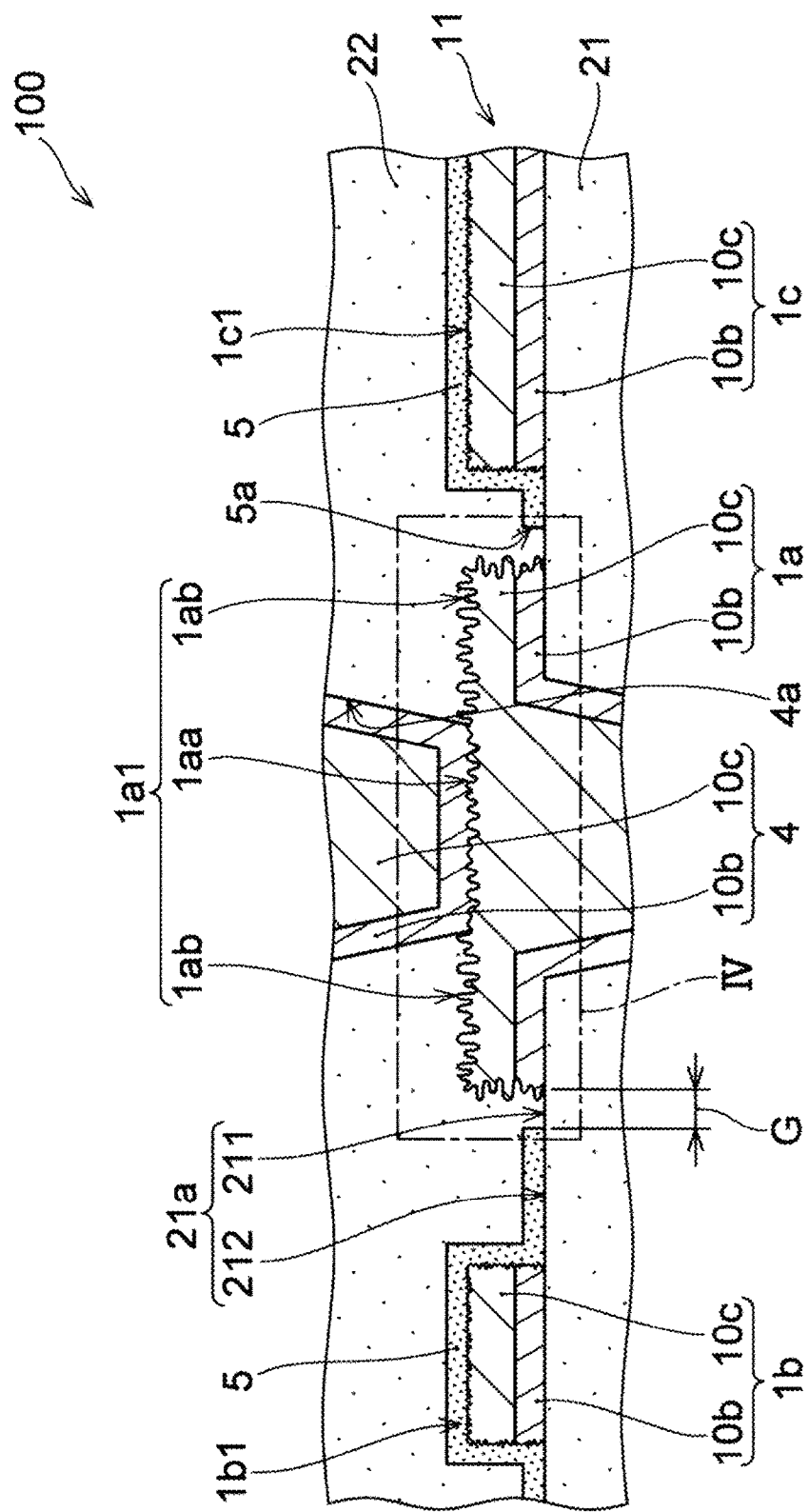
FIG. 3 is an enlarged view of a portion (III) of FIG. 1.
Figure 4:
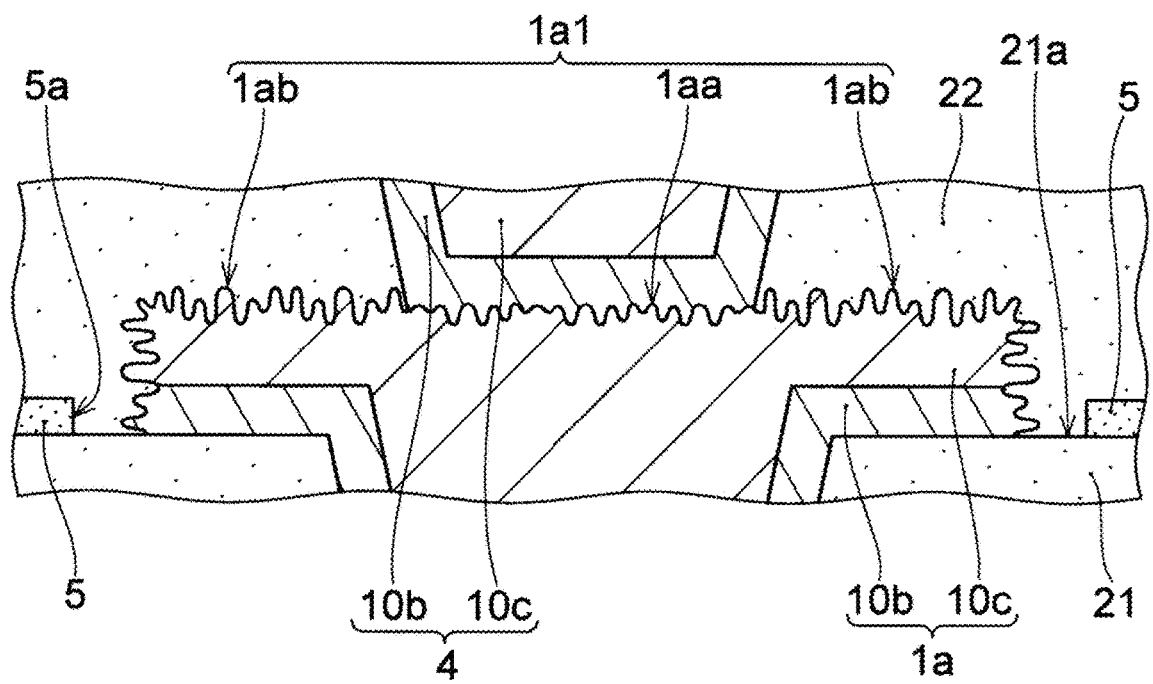
FIG. 4 is an enlarged view of a portion (IV) of FIG. 3.

FIG. 3 illustrates an enlarged view of a portion (III) of FIG. 1, and FIG. 4 illustrates an enlarged view of a portion (IV) of FIG. 3. The coating film 5 is described in detail with reference to FIGS. 3 and 4. As illustrated in FIGS. 3 and 4, the coating film 5 is formed on the surface of the first conductor layer 11 and on the surface (21a) of the first insulating layer 21, and is interposed between the first conductor layer 11 or the first insulating layer 21 and the second insulating layer 22. The coating film 5 partially covers the surface of the first conductor layer 11 and the surface (21a) of the first insulating layer 21. The surfaces of the first conductor layer 11 and the first insulating layer 21 facing the second insulating layer 22 are partially covered by the coating film 5. "Surfaces of the first conductor layer 11 and the first insulating layer 21 facing the second insulating layer 22" mean regions of the surfaces of the first conductor layer 11 and the first insulating layer 21 facing the second insulating layer 22. Similarly, "surfaces of the conductor pads (1a), the wiring patterns (1b), and the conductor pattern (1c) facing the second insulating layer 22" to be described later respectively mean regions of the surfaces of the conductor pads (1a), the wiring patterns (1b), and the conductor pattern (1c) facing the second insulating layer 22.

The coating film 5 in the example of FIG. 3 covers substantially the entire surfaces of the first conductor layer 11 and the first insulating layer 21 facing the second insulating layer 22 except for the conductor pads (1a) and portions surrounding the conductor pads (1a). The "surface of the first insulating layer 21 facing the second insulating layer 22" does not include a region of the surface (21a) of the first insulating layer 21 covered by the first conductor layer 11.

The coating film 5 improves adhesion between the first conductor layer 11 and the second insulating layer 22. The coating film 5 is formed of, for example, a material that can bind to both an organic material such as a resin forming the second insulating layer 22 and an inorganic material such as a metal forming the first conductor layer 11. The coating film 5 is formed of, for example, a material that contains both a reactive group capable of chemically bonding to an organic material and a reactive group capable of chemically bonding to an inorganic material. Therefore, the conductor patterns of the first conductor layer 11, which are covered by the coating film 5, and the second insulating layer 22 adhere to each other with sufficient strength. An example of a material of the coating film 5 is a silane coupling agent containing an azole silane compound such as a triazole compound. The material of the coating film 5 is not limited to a silane coupling agent as long as the material can increase the adhesion strength between the first conductor layer 11 and the second insulating layer 22 as compared to the case where the second insulating layer 22 is directly formed on the first conductor layer 11.

As illustrated in FIG. 3, in the present embodiment, surfaces (1b1) of the wiring patterns (1b) of the first conductor layer 11 facing the second insulating layer 22 are covered by the coating film 5. That is, as compared to the case where the coating film 5 is absent, the adhesion between the wiring patterns (1b) and the second insulating layer 22 is improved. Therefore, it is thought that floating or peeling off of the second insulating layer 22 from the wiring patterns (1b) is unlikely to occur.

In the example of FIG. 3, a surface (1c1) of the flat plate-shaped conductor pattern (1c) facing the second insulating layer 22 is also covered by the coating film 5. That is, as compared to the case where the coating film 5 is absent, adhesion between the conductor pattern (1c) and the second insulating layer 22 is improved. Therefore, it is thought that floating or peeling off of the second insulating layer 22 from the conductor pattern (1c) is unlikely to occur.

On the other hand, the conductor pads (1a) having the regions (connection regions) (1aa) covered by the connection conductors 4 in the surfaces (1a1) (surfaces other than surfaces facing the first insulating layer 21) are not covered by the coating film 5. The coating film 5 exposes the entire conductor pads (1a). That is, the coating film 5 is separated from the conductor pads (1a) without covering the conductor pads (1a). Therefore, for example, without intervention of an organic material such as a silane coupling agent, a metal such as copper that forms the conductor pads (1a) and a metal such as copper that forms the connection conductors 4 are in direct contact with each other at the interfaces between the conductor pads (1a) and the connection conductors 4. Therefore, it is thought that, at the interfaces between the conductor pads (1a) and the connection conductors 4, a mechanically strong metal-to-metal bond with a low electrical resistance is obtained.

The conductor pads (1a) are exposed inside the openings (5a) of the coating film 5. An area of each of the openings (5a) is larger than an area of each of the conductor pads (1a) in plan view. Therefore, entire surfaces (1ab), including side surfaces, of the conductor pads (1a) facing the second insulating layer 22 are exposed inside the openings (5a) without being covered by the coating film 5. The term "plan view" means viewing the wiring substrate 100 along its thickness direction. Further, the "surfaces (1ab) of the conductor pads (1a) facing the second insulating layer 22" are regions (non-connection regions) of the surfaces (1a1) of the conductor pads (1a) other than the connection regions (1aa) covered by the connection conductors 4.

As illustrated in FIG. 3, the surface (21a) of the first insulating layer 21 has a region (first region) 211 that is around the conductor pads (1a) and is not covered by the coating film 5. Further, the surface (21a) can have a region (second region) 212 that is around the first region 211 and is covered by the coating film 5 that covers the conductor patterns (for example, the wiring patterns (1b) and the conductor pattern (1c) in the example of FIG. 3) adjacent to the conductor pads (1a).

The surface (21a) of the first insulating layer 21 is in direct contact with the second insulating layer 22 in the first region 211. That is, a part of the second insulating layer 22 is interposed between the coating film 5 and the conductor pads (1a). A length of the part of the second insulating layer 22 interposed between the coating film 5 and the conductor pads (1a), that is, as a gap (G) between the conductor pads (1a) and the coating film 5 in a plan view, is, for example, 5 μm or more and 20 μm or less. When such a gap is ensured, it is thought that infiltration of various liquids reaching the coating film 5 from through holes (4a) (to be described later) during a manufacturing process is prevented with a high probability and such a gap does not significantly hinder miniaturization of the wiring substrate 100.

The connection conductors 4 are respectively formed on the connection regions (1aa) of the surfaces (1a1) of the conductor pads (1a) and are separated from the coating film 5. On the other hand, the surfaces (1ab) of the conductor pads (1a) facing the second insulating layer 22 are in direct contact with the second insulating layer 22. Therefore, the second insulating layer 22 is also interposed between the coating film 5 and the connection conductors 4.

Although omitted in FIG. 1 referenced above, as illustrated in FIG. 3, the conductor patterns (such as the conductor pads (1a), the wiring patterns (1b), and the conductor pattern (1c)) of the first conductor layer 11 have unevennesses of mutually different degrees on the surfaces that are not in contact with the first insulating layer 21. In other words, the first conductor layer 11 has multiple regions with mutually different surface roughnesses in its surface that is not in contact with the first insulating layer 21. In the example of FIG. 3, recesses of the unevennesses of the surfaces (1b1) and the surface (1c1) are filled with the coating film 5. On the other hand, recesses of the unevenness on the surfaces (1ab) of the conductor pads (1a) facing the second insulating layer 22 are filled with the second insulating layer 22.

In the first conductor layer 11 illustrated in FIG. 3, a height difference of the unevennesses of the regions (1ab) of the surfaces (1a1) of the conductor pads (1a) that are not covered by the connection conductors 4 is larger than a height difference of the unevenness on the surfaces (1b1) of the wiring patterns (1b). That is, the surfaces (1ab) of the conductor pads (1a) facing the second insulating layer 22 have a surface roughness (first surface roughness) higher than a surface roughness (second surface roughness) of the surfaces (1b1) of the wiring patterns (1b) covered by the coating film 5. The surfaces (1ab) of the conductor pads (1a) facing the second insulating layer 22 are roughened to have the first surface roughness higher than the second surface roughness. As will be described later, the surfaces (1ab) of the conductor pads (1a) are roughened by, for example, microetching or the like.

On the other hand, the surfaces (1b1) of the wiring patterns (1b) do not have to be roughened in a process that is actively provided for roughening the surfaces (1b1). The unevenness of the surfaces (1b1) may be generated by grain boundaries of the plating film (10c) or unevenness of a surface of a plating resist during the formation of the plating film (10c).

In the wiring substrate 100 of the present embodiment, the surfaces (1ab) of the conductor pads (1a) facing the second insulating layer 22 are roughened to have a relatively high surface roughness (first surface roughness). Therefore, it may be possible that peeling between the conductor pads (1a) and the second insulating layer 22 is suppressed. Specifically, unintentional infiltration of a liquid into interfaces between the conductor pads (1a) and the second insulating layer 22 is prevented by the unevenness of the surfaces (1ab) of the conductor pads (1a) having the relatively high first surface roughness. As a result, it may be possible that peeling between the conductor pads (1a) and the second insulating layer 22 that can be caused by such infiltration of a liquid is suppressed.

More specifically, in a manufacturing process of the wiring substrate 100, inner walls of through holes (4a) provided in the second insulating layer 22 for forming the connection conductors 4 may be exposed to various treatment solutions, plating solutions, or the like. Then, these liquids may infiltrate into the interfaces between the conductor pads (1a) and the second insulating layer 22 from the inner walls of the through holes (4a) and cause peeling between the conductor pads (1a) and the second insulating layer 22. However, in the present embodiment, unintentional infiltration of a liquid that can cause such peeling is prevented by the unevenness of the surfaces (1ab) of the conductor pads (1a) having the relatively high first surface roughness.

On the other hand, the surfaces (1b1) of the wiring patterns (1b) have a surface roughness (second surface roughness) lower than the first surface roughness of the surfaces of the conductor pads (1a). For example, for wiring patterns having highly roughened surfaces, in transmission of high-frequency signals, a substantial impedance may increase and transmission characteristics may deteriorate due to influence of a skin effect. Further, for example, for fine wiring patterns of about (10 μm)/(10 μm) ((wiring width)/(wiring interval)) or less, when their surfaces are highly roughened, it may be possible that desired shapes cannot be obtained after roughening with respect to designed wiring widths and thicknesses. However, in the present embodiment, since the surfaces (1b1) of the wiring patterns (1b) have a relatively low surface roughness, at least the second surface roughness lower than the first surface roughness, it is thought that a problem such as deterioration in high frequency transmission characteristics due to a high surface roughness is unlikely to occur.

And, the surfaces (1b1) of the wiring patterns (1b) are covered by the coating film 5 that improves the adhesion between the wiring patterns (1b) and the second insulating layer 22. A so-called anchor effect cannot be sufficiently obtained between a conductor layer having a surface with a relatively low surface roughness and an insulating layer formed on a surface of the conductor layer, and as a result, peeling between the conductor layer and the insulating layer may occur. However, since the surfaces (1b1) of the wiring patterns (1b) of the present embodiment are covered with the coating film 5, it is thought that peeling between the wiring patterns (1b) and the second insulating layer 22 is unlikely to occur.

Further, in the present embodiment, it is thought that deterioration in quality due to dissolution of the coating film 5 covering the first conductor layer 11 is unlikely to occur. As described above, in a manufacturing process of the wiring substrate 100, the inner walls of the through holes (4a) provided in the second insulating layer 22 can be exposed to various liquids. When a liquid infiltrates into an interface between the first conductor layer 11 and the second insulating layer 22, the infiltrated liquid may dissolve the coating film 5 formed on the surface of the first conductor layer 11. In this case, it is possible that the coating film 5 elutes into the through holes (4a), causing a poor connection between the connection conductors 4 and the conductor pads (1a) or causing peeling between the first conductor layer 11 and the second insulating layer 22 at a dissolution site of the coating film 5.

However, in the present embodiment, the conductor pads (1a) are not covered by the coating film 5, and the coating film 5 and the conductor pads (1a) are separated from each other. That is, the through holes (4a) in which the connection conductors 4 are formed and coating film 5 are separated from each other. Therefore, in a manufacturing process of the wiring substrate 100, even when various liquids infiltrate the interfaces between conductor pads (1a) and the second insulating layer 22 from the inner walls of the through holes (4a), the liquids are unlikely to reach the coating film 5. Therefore, the coating film 5 is unlikely to dissolve. That is, the first conductor layer 11 and the second insulating layer 22 are unlikely to peel off from each other. Further, even when the coating film 5 dissolves, it is difficult for the dissolution solution to elute into the through holes (4a). Therefore, a connection failure between the connection conductors 4 and the conductor pads (1a) is unlikely to occur. In this way, in the present embodiment, it is thought that dissolution of the coating film 5 is unlikely to occur, and a problem such as interface peeling or a connection failure or the like caused by the dissolution is prevented.

As described above, in the wiring substrate 100, good transmission characteristics and sufficient adhesion to the second insulating layer 22 are obtained in the wiring patterns (1b). In addition, deterioration in quality due to peeling or the like between the first conductor layer 11, which includes the conductor pads (1a) that are in contact with the connection conductors 4, and the second insulating layer 22 can be suppressed. In this way, according to the present embodiment, it is thought that desired characteristics in the wiring patterns and adhesion between the wiring patterns and the insulating layer can be ensured, and in addition, deterioration in quality of the wiring substrate due to peeling or the like between the conductor layer, which is in contact with the connection conductors that connect the conductor layers, and the insulating layer can be suppressed.

In order to achieve both good high frequency transmission characteristics in the wiring patterns (1b) and reliable prevention of infiltration of a liquid into the interfaces between the conductor pads (1a) and the second insulating layer 22, it is thought that a difference between the first surface roughness of the conductor pads (1a) and the second surface roughness of the wiring patterns (1b) is preferably large. For example, the first surface roughness of the surfaces (1ab) of the conductor pads (1a) is 100% or more higher than the second surface roughness of the surfaces (1b1) of the wiring patterns (1b). In this case, it is thought that good transmission characteristics for signals of high frequencies of the order of several GHz can be obtained in the wiring patterns (1b) while infiltration of a liquid into the interfaces between the conductor pads (1a) and the second insulating layer 22 is substantially reliably prevented.

The first surface roughness may be 200% or more and 1200% or less of the second surface roughness. In this case, it is thought that a roughening process of the conductor pads (1a) does not require an excessive time, and a damage to the first insulating layer 21 and the like during the roughening process is small. The first surface roughness of the surfaces (1ab) of the conductor pads (1a) is, for example, 0.3 μm or more and 0.6 μm or less in terms of arithmetic mean roughness (Ra). Further, the second surface roughness of the surfaces (1b1) of the wiring patterns (1b) is, for example, 0.05 μm or more and 0.15 μm or less in terms of an arithmetic mean roughness (Ra). That is, the arithmetic mean roughness (Ra) of the surfaces (1ab) of the conductor pads (1a) is equal to or more than twice the arithmetic mean roughness (Ra) of the surfaces (1b1) of the wiring patterns (1b).

In the example of FIG. 3, the surface (1c1) of the flat plate-shaped conductor pattern (1c) has a lower surface roughness than the first surface roughness of the surfaces (1ab) of the conductor pads (1a). The surface (1c1) does not have to be roughened in a process that is actively provided for roughening the surface (1c1). The surface (1c1) of the conductor pattern (1c) in the example of FIG. 3 has substantially the same surface roughness as the surface roughness (second surface roughness) of the surfaces (1b1) of the wiring patterns (1b). The surface (1c1) of the conductor pattern (1c) may have the second surface roughness. It is thought that good high-frequency transmission characteristics can also be obtained in the conductor pattern (1c). On the other hand, an anchor effect obtained on the surface (1c1) of the conductor pattern (1c) is thought to be small. However, as described above, the surface (1c1) of the conductor pattern (1c) is covered by the coating film 5. It is thought that interfacial peeling between the conductor pattern (1c) and the second insulating layer 22, where adhesion is enhanced by the coating film 5, is unlikely to occur.

In the wiring substrate 100, as illustrated in FIG. 4, the regions (connection regions) (1aa) of the surfaces (1a1) of the conductor pads (1a) covered by the connection conductors 4 have a lower surface roughness (third surface roughness) than the first surface roughness of the surfaces (1ab) facing the second insulating layer. The third surface roughness is higher than the second surface roughness of the surfaces (1b1) of the wiring patterns (1b) illustrated in FIG. 3. The connection regions (1aa) are not in contact with a resin such as the second insulating layer 22, and are not "surfaces of transmission paths" where current concentration occurs due to a skin effect. Therefore, neither large unevenness nor flatness is particularly required for the connection regions (1aa). Therefore, as illustrated in FIGS. 3 and 4, the connection region (1aa) of the upper surface (1a1) of each conductor pad (1a) can have any surface roughness (third surface roughness) between the first surface roughness and the second surface roughness.

Figure 5B:
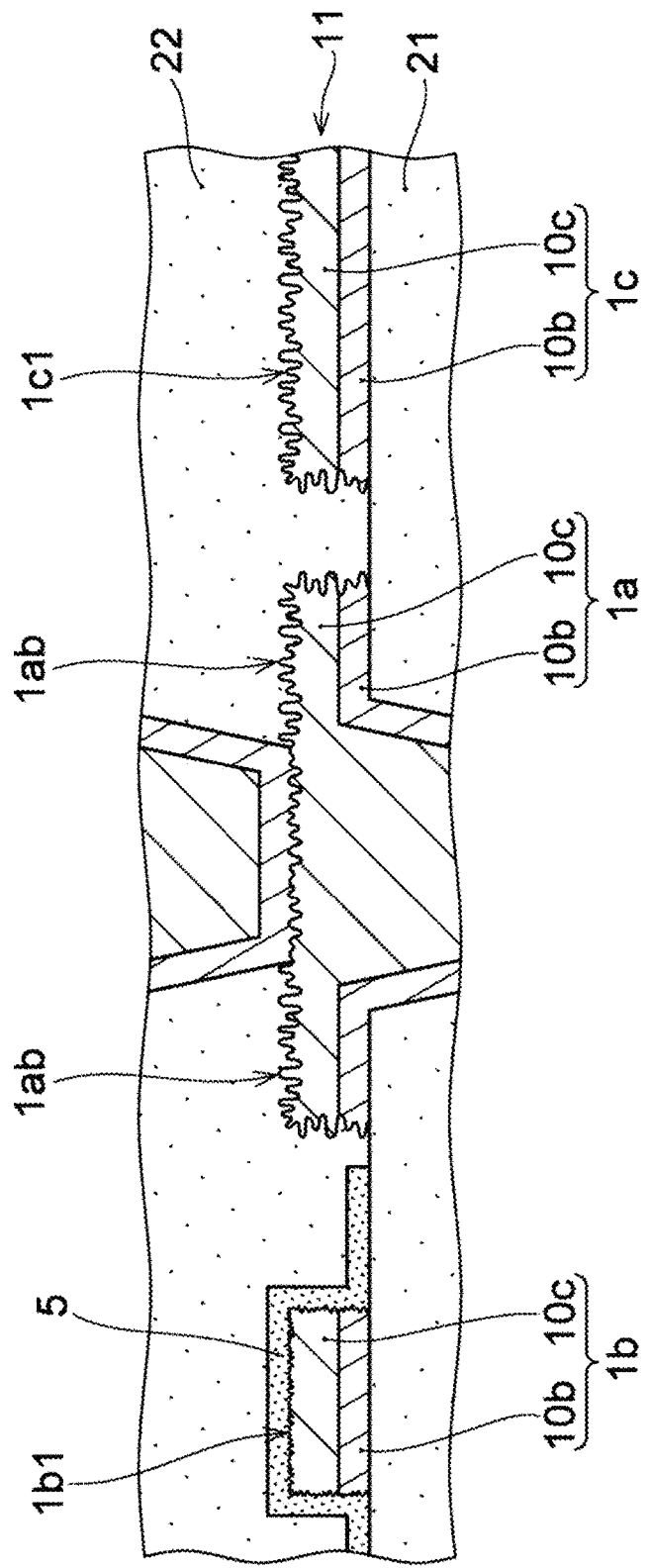
FIG. 5B is a cross-sectional view illustrating yet another example of a wiring substrate according to an embodiment of the present invention.

FIGS. 5A and 5B illustrate other examples of the wiring substrate of the present embodiment. FIGS. 5A and 5B are enlarged views of portions corresponding to the portion (III) of FIG. 1 in the other examples of the wiring substrate of the present embodiment. In FIGS. 5A and 5B, a structural element that is the same as in the example illustrated in FIG. 1 is indicated using the same reference numeral symbol as the one used in FIG. 3, which is an enlarged view of the portion (III) of FIG. 1, and a repeated description thereof is omitted.

In the example of FIG. 5A, the surface (1c1) of the flat plate-shaped conductor pattern (1c) is roughened to have a surface roughness higher than the surface roughness (second surface roughness) of the surfaces (1b1) of the wiring patterns (1b). In the example of FIG. 5A, the surface (1c1) has substantially the same surface roughness as the surface roughness (first surface roughness) of the surfaces (1ab) of the conductor pads (1a) facing the second insulating layer 22. In this way, the surface (1c1) of the conductor pattern (1c) may also be roughened to have the first surface roughness. For example, when high frequency signals are not transmitted in the conductor pattern (1c), it is thought that the high surface roughness of the surface (1c1) does not pose a particular problem. In the example of FIG. 5A, the surface (1c1) of the conductor pattern (1c) is covered by the coating film 5 similar to that in the example of FIG. 3. And, the surface of the coating film 5 covering the surface (1c1) has undulations based on the unevenness of the surface (1c1). It may be possible that, in addition to an adhesion improvement effect due to the coating film 5, an adhesion improvement effect due to an increase in contact area can be obtained.

In the example of FIG. 5B, the surface (1c1) of the conductor pattern (1c) is not covered by the coating film. That is, the surface (1c1) of the conductor pattern (1c) and the second insulating layer 22 are in direct contact with each other without intervention of the coating film 5. However, similar to the example of FIG. 5A, the surface (1c1) of the conductor pattern (1c) has a surface roughness higher than the surface roughness (second surface roughness) of the surfaces (1b1) of the wiring patterns (1b). The surface (1c1) of the conductor pattern (1c) may have the first surface roughness of the surfaces (1ab) of the conductor pads (1a) facing the second insulating layer 22. It is thought that, since a sufficient anchor effect is obtained between the conductor pattern (1c) and the second insulating layer 22, interfacial peeling is unlikely to occur.

Next, a method for manufacturing the wiring substrate of the embodiment is described with reference to FIGS. 6A-6H using the wiring substrate 100 of FIG. 1 as an example.

Figure 6A:
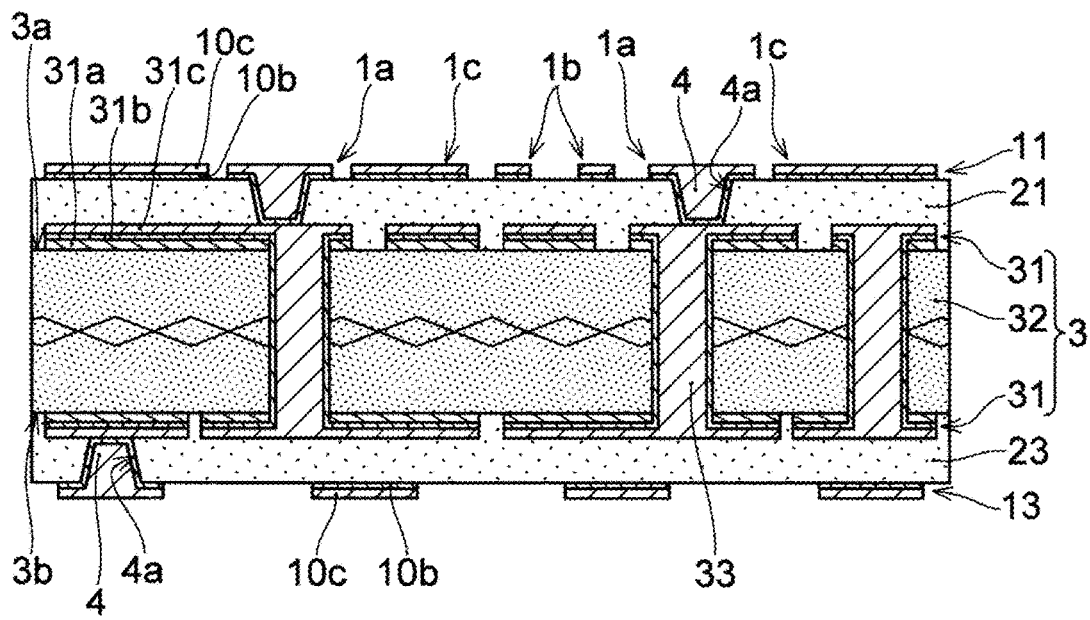
FIG. 6A is a cross-sectional view illustrating an example of a manufacturing process of a wiring substrate according to an embodiment of the present invention.

As illustrated in FIG. 6A, a starting substrate (for example, a double-sided copper-clad laminated plate) that includes an insulating layer, which is to become the insulating layer 32 of the core substrate 3, and the metal foils (31a) that are respectively laminated on both sides of the insulating layer is prepared, and the conductor layers 31 and the connection conductors 33 of the core substrate 3 are formed. For example, through holes are formed at formation positions of the connection conductors 33 by drilling or irradiation of $CO_2$ laser, and the metal film (31b) is formed in the through holes and on the metal foils (31a) by electroless plating or sputtering or the like. Then, the plating film (31c) is formed by electrolytic plating using the metal film (31b) as a power feeding layer. As a result, the conductor layers 31 having a three-layer structure, and the connection conductors 33 having a two-layer structure, are formed. After that, the core substrate 3 having predetermined conductor patterns is obtained by patterning the conductor layers 31 using a subtractive method.

Then, the first insulating layer 21 and the insulating layer 23 are respectively formed on the first surface (3a) and the second surface (3b) of the core substrate 3. In forming each of the first insulating layer 21 and the insulating layer 23, for example, a film-like epoxy resin is laminated on the core substrate 3 and is heated and pressed. As a result, the first insulating layer 21 and the insulating layer 23 are formed. The first insulating layer 21 and the insulating layer 23 can be formed using any resin such as a BT resin or a phenol resin without being limited to using a film-like epoxy resin. In the first insulating layer 21 and the insulating layer 23, the through holes (4a) for forming the connection conductors 4 are formed by, for example, irradiation of $CO_2$ laser.

The method for manufacturing the wiring substrate of the present embodiment includes, as illustrated in FIG. 6A, forming the first conductor layer 11 having the conductor pads (1a) and the wiring patterns (1b) on the first insulating layer 21. In the example of FIG. 6A, the first conductor layer 11 including the conductor patterns (1c) in addition to the conductor pads (1a) and wiring patterns (1b) is formed. The conductor layer 13 is formed on the second surface (3b) side of the core substrate 3. The connection conductors 4 are formed in the first insulating layer 21 and the insulating layer 23.

The first conductor layer 11, the conductor layer 13, and the connection conductors 4 are formed using, for example, a semi-additive method. That is, the metal film (10b) is formed in the through holes (4a) and on the surfaces of the first insulating layer 21 and the insulating layer 23, for example, by electroless plating or sputtering. A plating resist (not illustrated in the drawings) having openings corresponding to the conductor pads (1a), the wiring patterns (1b), and the conductor pattern (1c), or openings corresponding to conductor patterns to be included in the conductor layer 13 is formed on the metal film (10b). Then, the plating film (10c) is formed in the openings of the plating resist by electrolytic plating using the metal film (10b) as a power feeding layer. As a result, the first conductor layer 11 and the conductor layer 13, which are formed of the metal film (10b) and the plating film (10c), are formed. The connection conductors 4, which are formed of the metal film (10b) and the plating film (10c), are formed in the through holes (4a). After that, the plating resist is removed, for example, using an alkaline peeling agent such as sodium hydroxide, and further, a portion of the metal film (10b) that is exposed without being covered by the plating film (10c) is removed by etching or the like.

Figure 6B:
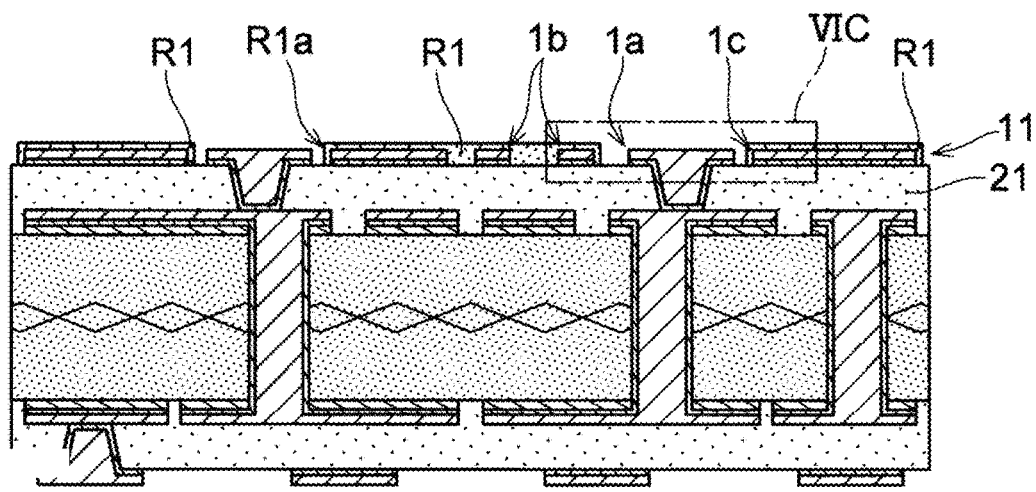
FIG. 6B is a cross-sectional view illustrating an example of a manufacturing process of a wiring substrate according to an embodiment of the present invention.
Figure 6C:
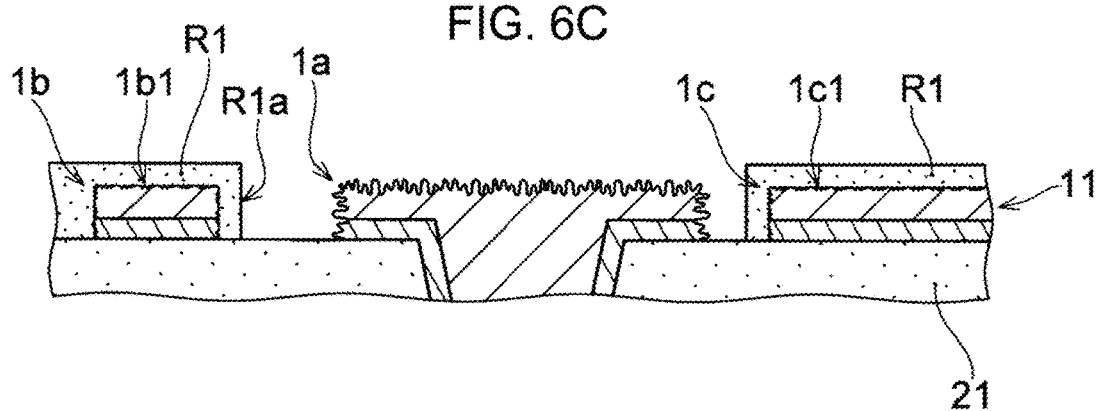
FIG. 6C is a cross-sectional view illustrating an example of a manufacturing process of a wiring substrate according to an embodiment of the present invention.

The method for manufacturing the wiring substrate of the present embodiment includes, as illustrated in FIGS. 6B and 6C, roughening exposed surfaces, which are regions of the surfaces of the conductor pads (1a) that are not in contact with the first insulating layer 21. FIG. 6C is an enlarged view of an exposed surface of a conductor pad (1a) in a portion (VIC) of FIG. 6B after the roughening treatment. In the method for manufacturing the wiring substrate of the present embodiment, exposed surfaces of the wiring patterns (1b) are not roughened. Therefore, as illustrated in FIGS. 6B and 6C, in the roughening of the exposed surfaces of the conductor pads (1a), a resist film (R1) covering the wiring patterns (1b) is provided. Thus, the roughening of the exposed surfaces of the conductor pads (1a) can include providing the resist film (R1) that covers the wiring patterns (1b). In the wiring substrate 100 of FIG. 1, the surface of the conductor pattern (1c) is not roughened. Therefore, the resist film (R1) of FIGS. 6B and 6C is provided to also cover the conductor pattern (1c).

The resist film (R1) is formed, for example, by laminating a film containing a photosensitive resin. Openings (R1a) exposing at least the conductor pads (1a) are provided in the resist film (R1) using photolithography technologies such as exposure and development. For example, the resist film (R1) is formed of the same material as that of the plating resist (not illustrated in the drawings) used in the formation of the first conductor layer 11 described above.

The roughening of the exposed surfaces of the conductor pads (1*a*) can be performed using any method. For example, the exposed surfaces of the conductor pads (1*a*) are roughened by a surface oxidation treatment called a blackening treatment or a browning treatment or by a micro-etching treatment using an acidic solvent.

The exposed surfaces of the conductor pads (1*a*) are roughened to have at least a surface roughness (first surface roughness) higher than the surface roughness (second surface roughness) of the unroughened surfaces (1*b*1) of the wiring patterns (1*b*). The exposed surfaces of the conductor pads (1*a*) are roughened, for example, to have a surface roughness of 0.3 µm or more and 0.6 µm or less in terms of arithmetic mean roughness (Ra). After the roughening of the exposed surfaces of the conductor pads (1*a*), the resist film (R1) is removed, for example, using an alkaline peeling agent such as sodium hydroxide.

Figure 6D:
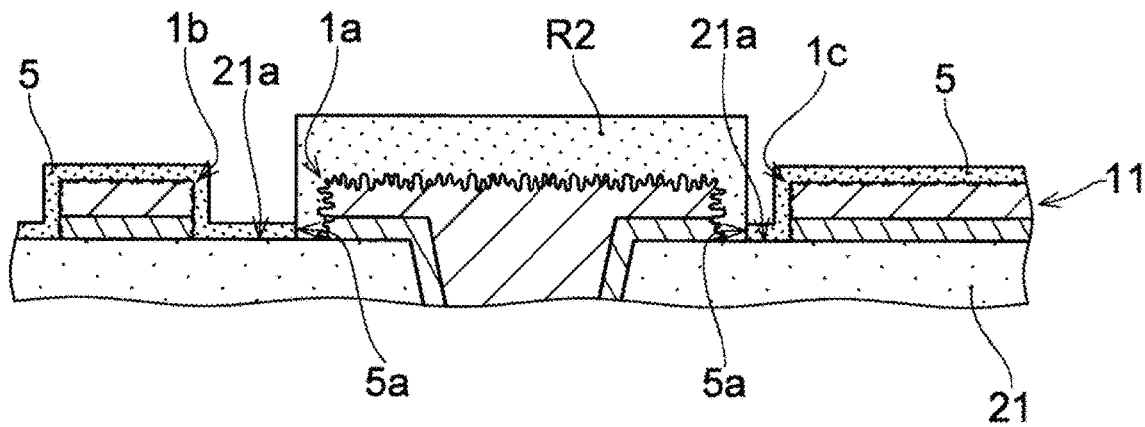
FIG. 6D is a cross-sectional view illustrating an example of a manufacturing process of a wiring substrate according to an embodiment of the present invention.

As illustrated in FIG. 6D, the method for manufacturing the wiring substrate of the present embodiment further includes providing the coating film 5 that partially covers the first insulating layer 21 and the first conductor layer 11. FIG. 6D illustrates a state after the formation of the coating film 5 in the same portion as FIG. 6C. The coating film 5 improves the adhesion between the first conductor layer 11 and the second insulating layer 22 (see FIG. 6E) formed in a subsequent process. The coating film 5 is provided on the first insulating layer 21 and the first conductor layer 11 so as to expose the entire conductor pads (1*a*). In other words, the coating film 5 is provided so as to cover a region other than the conductor pads (1*a*) and regions around the conductor pads (1*a*). In the example of FIG. 6D, the coating film 5 is provided so as to cover substantially the entire region of the first insulating layer 21 and the first conductor layer 11 other than the conductor pads (1*a*) and the regions around the conductor pads (1*a*).

In the example of FIG. 6D, a resist film (R2) covering the conductor pads (1*a*) is formed in order to form the coating film 5 that exposes the entire conductor pads (1*a*). The resist film (R2) is formed of, for example, a photosensitive material same as the resist film (R1) (see FIG. 6C) used for the roughening of the exposed surfaces of the conductor pads (1*a*) described above. In this case, by exposure and development, the resist film (R2) that covers only desired regions, for example, as in the example of FIG. 6D, the resist film (R2) that covers only the conductor pads (1*a*) and portions around the conductor pads (1*a*) is formed. Then, the coating film 5 is formed on the first insulating layer 21 and the first conductor layer 11 that are not covered by the resist film (R2). For example, as in the example of FIG. 6D, the coating film 5 is formed on the wiring patterns (1*b*) and the conductor pattern (1*c*) and on the surface (21*a*) of the first insulating layer 21 around the wiring patterns (1*b*) and the conductor pattern (1*c*).

The coating film 5 is formed, for example, by immersion of the first conductor layer 11 and the first insulating layer 21 in a liquid containing a material such as a silane coupling agent that can bind to both an organic material and an inorganic material, or by spraying of such a liquid. However, a method for forming the coating film 5 is arbitrary, and is not limited to immersion in a material forming the coating film 5 or spraying of such a material.

After the formation of the coating film 5, the resist film (R2) is removed, for example, using an alkaline peeling agent such as sodium hydroxide. As a result, the coating film 5 is formed having the openings (5*a*) in regions where the resist film (R2) is removed. The entire side surfaces and upper surfaces of the conductor pads (1*a*) covered by the resist film (R2) are exposed inside the openings (5*a*). In this way, providing the coating film 5 can include: forming the resist film (R2) that covers the conductor pads (1*a*); forming the coating film 5 on the first insulating layer 21 and the first conductor layer 11 that are not covered by the resist film (R2); and removing the resist film (R2) after the formation of the coating film 5. Further, providing the coating film 5 may include forming, in the coating film 5, the openings (5*a*) that expose the entire conductor pads (1*a*) by masking the conductor pads (1*a*) and regions surrounding the conductor pads (1*a*) using, for example, a masking measure such as the resist film (R2).

Figure 6E:
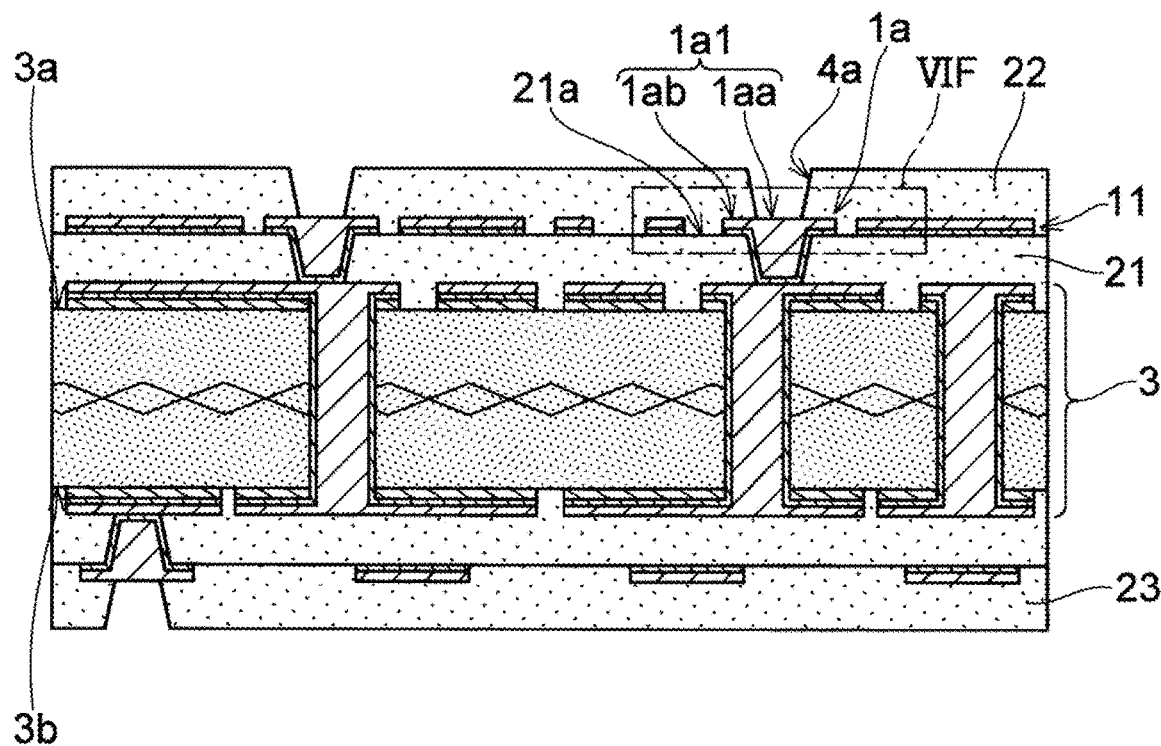
FIG. 6E is a cross-sectional view illustrating an example of a manufacturing process of a wiring substrate according to an embodiment of the present invention.
Figure 6F:
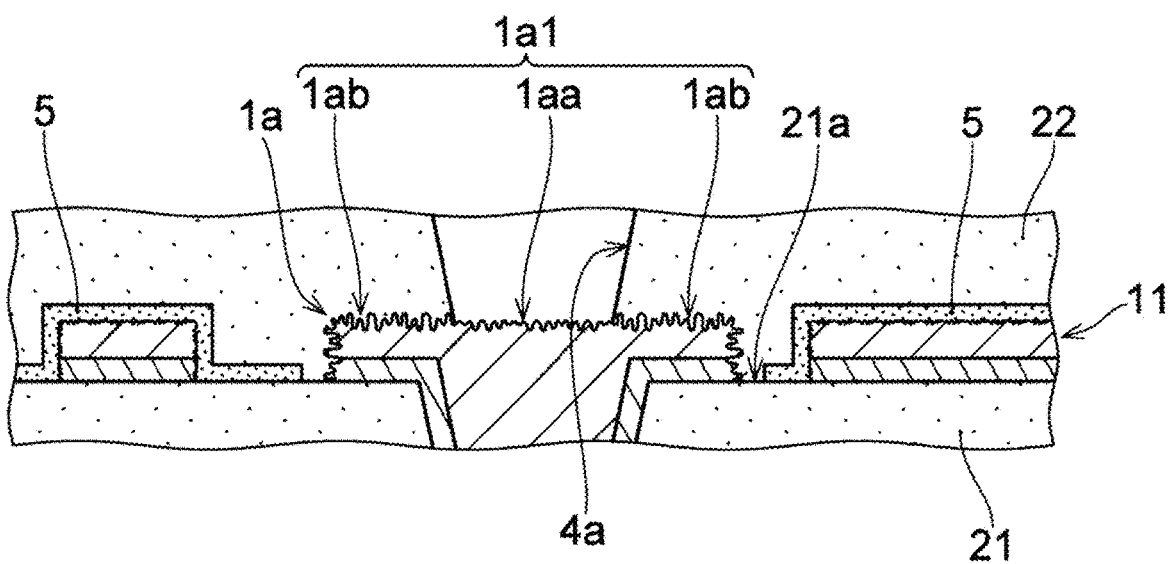
FIG. 6F is a cross-sectional view illustrating an example of a manufacturing process of a wiring substrate according to an embodiment of the present invention.

As illustrated in FIGS. 6E and 6F, the method for manufacturing the wiring substrate of the present embodiment further includes forming the second insulating layer 22 that covers the coating film 5 and the conductor pads (1*a*). FIG. 6F illustrates an enlarged view of a portion (VIF) of FIG. 6E. By the formation of the second insulating layer 22, the entire surfaces (1*a*1) (surfaces other than surfaces facing the first insulating layer 21) of the conductor pads (1*a*) are temporarily covered by the second insulating layer 22. The second insulating layer 22 is formed to cover also a region of the surface (21*a*) of the first insulating layer 21 that is not covered by any of the first conductor layer 11 and the coating film 5. The insulating layer 23 is further formed on the second surface (3*b*) side of the core substrate 3. Similar to the first insulating layer 21, the second insulating layer 22 and the insulating layer 23 are each formed, for example, by laminating a film-like epoxy resin and applying heat and pressure thereto.

In the second insulating layer 22 and the insulating layer 23, the through holes (4*a*) for forming the connection conductors 4 (see FIG. 6G) in a subsequent process are formed, for example, by irradiation of $CO_2$ laser or the like. The through holes (4*a*) are formed in the second insulating layer 22 on regions (the connection regions (1*aa*)) of the conductor pads (1*a*). In this way, forming the connection conductors 4 in a subsequent process can include forming the through holes (4*a*) in the second insulating layer 22 that respectively partially expose the conductor pads (1*a*) covered by the second insulating layer 22. Since the conductor pads (1*a*) are not covered by the coating film 5, the through holes (4*a*) that respectively partially expose the conductor pads (1*a*) are formed so as to be separated from the coating film 5. By the formation of the through holes (4*a*), the connection regions (1*aa*), which are portions of the surfaces (1*a*1) of the conductor pads (1*a*), are exposed. The connection region (1*aa*) are portions of the surfaces (1*a*1) to be connected to the connection conductors 4 in a subsequent process. The regions (1*ab*) (surfaces facing the second insulating layer 22) of the surfaces (1*a*1) other than the connection regions (1*aa*) remain covered by the second insulating layer 22.

When the surfaces of the conductor pads (1*a*) to be irradiated with laser, for example, during the formation of the through holes (4*a*) are covered by the coating film 5, due to the laser irradiation, the coating film 5 may dissolve and infiltrate into the interfaces between the conductor pads (1*a*) and the second insulating layer 22. Then, the dissolution solution may cause interfacial peeling or the like. However, in the method for manufacturing the wiring substrate of the present embodiment, as described above, since the coating film 5 is provided so as to expose the entire conductor pads (1*a*), the surfaces (1*a*1) of the conductor pads (1*a*) are not covered by the coating film 5. Therefore, dissolution of the coating film 5 is prevented, and infiltration of a dissolution solution of the coating film 5 into the interfaces between the conductor pads (1a) and the second insulating layer 22 is unlikely to occur.

After the formation of the through holes (4a), preferably, a desmear treatment is performed in which resin residues (smears) generated by the formation of the through holes (4a) are removed. For example, the smears in the through holes (4a) are removed by exposing inner walls of the through holes (4a) to a treatment liquid such as an alkaline permanganate solution. Infiltration of a processing liquid for the desmear treatment into the interfaces between the conductor pads (1a) and the second insulating layer 22 is prevented by the unevenness of the roughened surfaces (1a1) of the conductor pads (1a), in particular, the surfaces (1ab) facing the second insulating layer 22. It is thought that a defect such as interfacial peeling between the conductor pads (1a) and the second insulating layer 22 is prevented.

Preferably, a soft etching process is performed prior to the formation of the second conductor layer 12 and the connection conductors 4 (see FIG. 6G) in a subsequent process. By the soft etching process, an oxide film on the surfaces (exposed portions of the surfaces (1a1) of the conductor pads (1a) and the surface of the second insulating layer 22) on which the second conductor layer 12 and the connection conductors 4 are formed is removed. Further, by the soft etching process, as illustrated in FIG. 6F, the surface roughness of the connection regions (1aa) of the surfaces (1a1) of the conductor pads (1a) exposed in the through holes (4a) is reduced to a surface roughness (third surface roughness) lower than the first surface roughness of the surfaces (1ab) facing the second insulating layer 22.

Figure 6G:
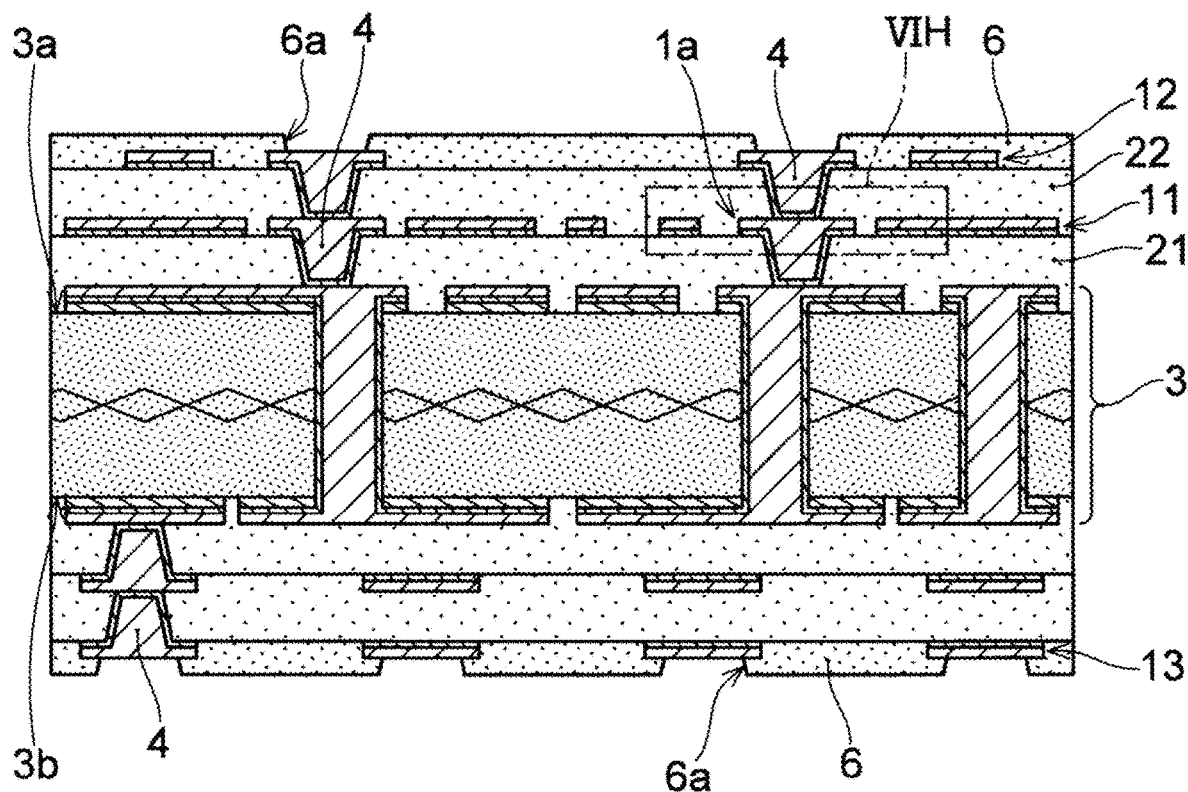
FIG. 6G is a cross-sectional view illustrating an example of a manufacturing process of a wiring substrate according to an embodiment of the present invention.
Figure 6H:
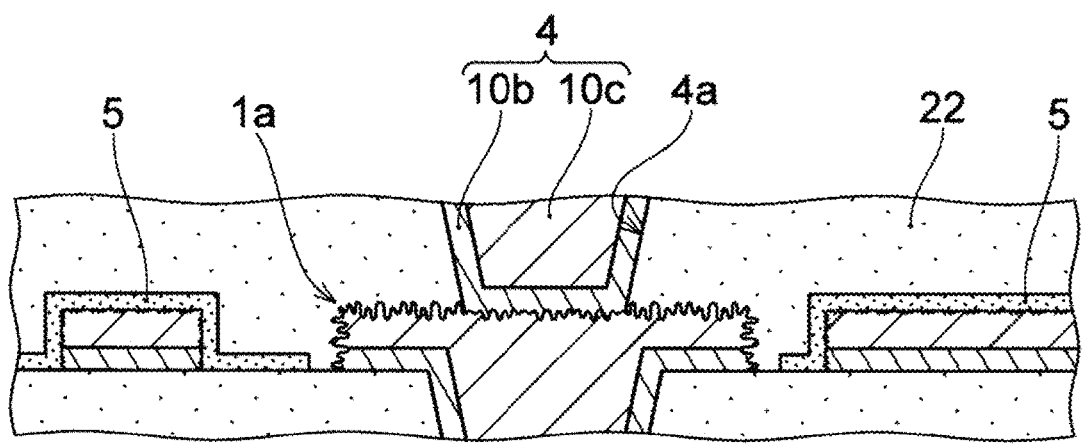
FIG. 6H is a cross-sectional view illustrating an example of a manufacturing process of a wiring substrate according to an embodiment of the present invention.

As illustrated in FIGS. 6G and 6H, the method for manufacturing the wiring substrate of the present embodiment further includes: forming the second conductor layer 12 on the second insulating layer 22; and forming the connection conductors 4 that penetrate the second insulating layer 22 and connect the conductor pads (1a) and the second conductor layer 12. FIG. 6H illustrates an enlarged view of a portion (VIH) of FIG. 6G. The connection conductors 4 are formed in the through holes (4a). Therefore, the connection conductors 4 are formed so as to be separated from the coating film 5. On the second surface (3b) side of the core substrate 3, the conductor layer 13 and the connection conductors 4 are further formed.

The second conductor layer 12 and the connection conductors 4 that penetrate the second insulating layer 22 are formed, for example, using the same method as the above-described method for forming the first conductor layer 11 and the connection conductors 4 that penetrate the first insulating layer 21. For example, the second conductor layer 12 and the connection conductors 4 that penetrate the second insulating layer 22, and the conductor layer 13 and the connection conductors 4 that are further formed on the second surface (3b) side of the core substrate 3, are formed using a semi-additive method.

In the example of FIG. 6G in which the wiring substrate 100 is manufactured, the solder resists 6 are formed. The solder resists 6 are provided with the openings (6a) that each expose a part of the second conductor layer 12 or a part of the conductor layer 13. The solder resists 6 and the openings (6a) are formed, for example, by forming a resin layer containing a photosensitive epoxy resin or polyimide resin or the like and performing exposure and development using a mask having appropriate opening patterns.

In the formation of the connection conductors 4 in the second insulating layer 22 using a semi-additive method, as illustrated in FIG. 6H, in the through holes (4a), for example, the metal film (10b) is formed by electroless plating and the plating film (10c) is formed by electrolytic plating. In the method for manufacturing the wiring substrate of the present embodiment, infiltration of a plating solution into the interfaces between the conductor pads (1a) and the second insulating layer 22 during the formation of the metal film (10b) is prevented by the unevenness of the roughened surfaces of the conductor pads (1a). It is thought that a defect such as interfacial peeling between the conductor pads (1a) and the second insulating layer 22 due to infiltration of a plating solution is prevented.

Through the above processes, the wiring substrate 100 in the example of FIG. 1 is completed. A surface protective film (not illustrated in the drawings) may be formed on a surface of a part of the second conductor layer 12 or the conductor layer 13 exposed in the openings (6a) of the solder resists 6 by electroless plating, solder leveling, spray coating, or the like.

When the wiring substrate of the example of FIG. 5A referenced above is manufactured, in the process illustrated in FIG. 6C, the exposed surface of the first conductor layer 11 is roughened without providing the resist film (R1) that covers the conductor pattern (1c). As a result, the surface (1c1) of the conductor pattern (1c) is also roughened so as to have substantially the same surface roughness as the exposed surfaces of the conductor patterns (1a).

Further, when the wiring substrate in the example of FIG. 5B referenced above is manufactured, in the process illustrated in FIG. 6D, the resist film (R2) is also provided on the conductor pattern (1c), and in this state, the coating film 5 is formed. As a result, the coating film 5 is formed that also exposes the surface (1c1) of the conductor pattern (1c).

The wiring substrate of the embodiment is not limited to those having the structures illustrated in the drawings and those having the structures, shapes, and materials exemplified herein. As described above, the wiring substrate of the embodiment can have any laminated structure. For example, the wiring substrate of the embodiment may be a coreless substrate that does not include a core substrate. The wiring substrate of the embodiment can include any number of conductor layers and any number of insulating layers. The first conductor layer 11 can exist at any layer on a laminated structure of the wiring substrate. The first conductor layer 11 does not have to include the plating film (10c) formed of an electrolytic plating film, and may include, for example, only the metal film (10b) formed of an electroless plating film. Further, all or some of the multiple conductor layers included in the wiring substrate may include the conductor pads (1a), the wiring patterns (1b), and the conductor pattern (1c) as included in the first conductor layer 11. Further, the conductor pads (1a) do not have to be via pads of connection conductors that penetrate an insulating layer (the first insulating layer 21 in the wiring substrate 100) below the first conductor layer 11.

The method for manufacturing a wiring substrate of the embodiment is not limited the method described with reference to the drawings. For example, the first and second conductor layers (11, 12) may be formed using a full additive method. Further, the first and second insulating layers (21, 22) can be formed using a resin in any form without being limited to a film-like resin. Further, it is also possible that the connection conductors are not formed in the insulating layers other than the second insulating layer 22. In the method for manufacturing the wiring substrate of the embodiment, it is also possible that any process other than the processes described above is added, or some of the processes described above are omitted.

In the method described in Japanese Patent Application Laid-Open Publication No. 2018-172759, the chemical conversion coating film formed on the surface of the metal wiring layer may be dissolved by various treatments in subsequent processes. Therefore, in a printed wiring board manufactured using the method of Japanese Patent Application Laid-Open Publication No. 2018-172759, an unintended defect due to a dissolution solution of the chemical conversion coating film may occur, causing deterioration in quality of the printed wiring board.

A wiring substrate according to an embodiment of the present invention includes: a first insulating layer; a first conductor layer formed on a surface of the first insulating layer; a second insulating layer formed on the first insulating layer and the first conductor layer; a second conductor layer formed on the second insulating layer; a connection conductor that penetrates the second insulating layer and connects the first conductor layer and the second conductor layer to each other; and a coating film that is formed on a surface of the first conductor layer and improves adhesion between the first conductor layer and the second insulating layer. The first conductor layer includes a conductor pad in contact with the connection conductor and a wiring pattern covered by the coating film. A surface of the conductor pad facing the second insulating layer has a first surface roughness higher than a surface roughness of a surface of the wiring pattern. The coating film exposes the entire conductor pad.

A method for manufacturing a wiring substrate according to an embodiment of the present invention includes: forming a first conductor layer having a conductor pad and a wiring pattern on a first insulating layer; roughening an exposed surface of the conductor pad; providing a coating film that partially covers the first insulating layer and the first conductor layer; forming a second insulating layer that covers the coating film and the conductor pad; forming a second conductor layer on the second insulating layer; and forming a connection conductor that penetrates the second insulating layer and connects the conductor pad and the second conductor layer to each other. The coating film is provided on the first insulating layer and the first conductor layer so as to expose the entire conductor pad.

According to an embodiment of the present invention, it may be possible that desired characteristics of the wiring patterns and adhesion between the wiring patterns and the insulating layer can be ensured, and in addition, deterioration in quality of the wiring substrate due to peeling between the conductor pads, which are in contact with the connection conductors that connect the conductor layers, and the insulating layer can be suppressed.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate, comprising:
   a first insulating layer;
   a first conductor layer formed on the first insulating layer;
   a second insulating layer formed on the first insulating layer such that the second insulating layer is covering the first conductor layer;
   a second conductor layer formed on the second insulating layer on an opposite side with respect to the first conductor layer;
   a connection conductor penetrating through the second insulating layer and connecting the first conductor layer and the second conductor layer; and
   a coating film formed on a surface of the first conductor layer such that the coating film is adhering the first conductor layer and the second insulating layer,
   wherein the first conductor layer includes a conductor pad and a wiring pattern such that the conductor pad is in contact with the connection conductor and that the wiring pattern is covered by the coating film, the conductor pad of the first conductor layer has a surface facing the second insulating layer and having a first surface roughness that is higher than a surface roughness of a surface of the wiring pattern, and the coating film has an opening such that the opening is exposing the conductor pad entirely.

2. The wiring substrate according to claim 1, wherein the coating film is formed such that the opening has an area that is larger than an area of the conductor pad.

3. The wiring substrate according to claim 1, wherein the coating film is formed such that the coating film covers substantially an entire surface of the first insulating layer facing the second insulating layer.

4. The wiring substrate according to claim 1, wherein the coating film is formed such that a gap is formed between the conductor pad and the coating film and that the gap formed between the conductor pad and the coating film is in a range of 5 μm to 20 μm.

5. The wiring substrate according to claim 1, wherein the coating film is formed such that the second insulating layer has a portion interposed between the coating film and the conductor pad.

6. The wiring substrate according to claim 1, wherein the first conductor layer further includes a flat plate-shaped conductor pattern extending over a region where the conductor pad and the wiring pattern are not formed such that a surface of the flat plate-shaped conductor pattern facing the second insulating layer is covered by the coating film.

7. The wiring substrate according to claim 1, wherein the first conductor layer further includes a flat plate-shaped conductor pattern extending over a region where the conductor pad and the wiring pattern are not formed such that a surface of the flat plate-shaped conductor pattern facing the second insulating layer has the first surface roughness.

8. The wiring substrate according to claim 2, wherein the coating film is formed such that the coating film covers substantially an entire surface of the first insulating layer facing the second insulating layer.

9. The wiring substrate according to claim 2, wherein the coating film is formed such that a gap is formed between the conductor pad and the coating film and that the gap formed between the conductor pad and the coating film is in a range of 5 μm to 20 μm.

10. The wiring substrate according to claim 2, wherein the coating film is formed such that the second insulating layer has a portion interposed between the coating film and the conductor pad.

11. The wiring substrate according to claim 2, wherein the first conductor layer further includes a flat plate-shaped conductor pattern extending over a region where the conductor pad and the wiring pattern are not formed such that a surface of the flat plate-shaped conductor pattern facing the second insulating layer is covered by the coating film.

12. The wiring substrate according to claim 2, wherein the first conductor layer further includes a flat plate-shaped conductor pattern extending over a region where the conductor pad and the wiring pattern are not formed such that a surface of the flat plate-shaped conductor pattern facing the second insulating layer has the first surface roughness.

13. The wiring substrate according to claim 3, wherein the coating film is formed such that a gap is formed between the conductor pad and the coating film and that the gap formed between the conductor pad and the coating film is in a range of 5 µm to 20 µm.

14. The wiring substrate according to claim 3, wherein the coating film is formed such that the second insulating layer has a portion interposed between the coating film and the conductor pad.

15. The wiring substrate according to claim 3, wherein the first conductor layer further includes a flat plate-shaped conductor pattern extending over a region where the conductor pad and the wiring pattern are not formed such that a surface of the flat plate-shaped conductor pattern facing the second insulating layer is covered by the coating film.

16. The wiring substrate according to claim 3, wherein the first conductor layer further includes a flat plate-shaped conductor pattern extending over a region where the conductor pad and the wiring pattern are not formed such that a surface of the flat plate-shaped conductor pattern facing the second insulating layer has the first surface roughness.

17. A method for manufacturing a wiring substrate, comprising:
   forming a first conductor layer on a first insulating layer such that the first conductor layer includes a conductor pad and a wiring pattern;
   roughening a surface of the conductor pad of the first conductor layer formed on the first insulating layer;
   forming a coating film on the first insulating layer and the first conductor layer such that the conductor pad is exposed entirely from the coating film;
   forming a second insulating layer on the first insulating layer such that the second insulating layer covers the coating film and the conductor pad;
   forming a second conductor layer on the second insulating layer on an opposite side with respect to the first conductor layer; and
   forming a connection conductor penetrating through the second insulating layer such that the connection conductor connects the second conductor layer and the conductor pad of the first conductor layer,
   wherein the wiring pattern is covered by the coating film, the coating film is formed on a surface of the first conductor layer such that the coating film is adhering the first conductor layer and the second insulating layer, the conductor pad of the first conductor layer has a surface facing the second insulating layer and having a first surface roughness that is higher than a surface roughness of a surface of the wiring pattern, and the forming of the coating film includes forming an opening in the coating film such that the opening exposes the conductor pad entirely.

18. The method for manufacturing a wiring substrate according to claim 17, wherein the forming of the coating film includes forming a resist film on the first insulating layer and the first conductor layer such that the resist film entirely covers the conductor pad of the first conductor layer, forming the coating film on the first insulating layer and the first conductor layer such that the coating film covers portions of the first insulating layer and first conductor layer not covered by the resist film, and removing the resist film from the first insulating layer and the first conductor layer after the forming of the coating film.

19. The method for manufacturing a wiring substrate according to claim 17, wherein the forming of the connection conductor includes forming a through hole in the second insulating layer such that the through hole exposes a portion of the conductor pad and is separated from the coating film.

20. The method for manufacturing a wiring substrate according to claim 17, wherein the roughening of the surface of the conductor pad includes forming a resist film such that the resist film covers the wiring pattern of the first conductor layer.

* * * * *